United States Patent [19]

Stitzer et al.

[11] Patent Number: 4,595,889
[45] Date of Patent: Jun. 17, 1986

[54] FREQUENCY SELECTIVE SIGNAL-TO-NOISE ENHANCER/LIMITER APPARATUS

[75] Inventors: Steven N. Stitzer, Ellicott City, Md.; Harry Goldie, deceased, late of Randallstown, Md., by Fritzi Goldie, legal representative

[73] Assignee: The United States of America as represented by the Secretary of the Air Force, Washington, D.C.

[21] Appl. No.: 675,171

[22] Filed: Nov. 27, 1984

[51] Int. Cl.$^4$ .................. H01P 1/215; H01P 1/23; H01P 5/04
[52] U.S. Cl. .................. 333/17 L; 333/24.1
[58] Field of Search .................. 333/17 L, 24.1, 24.2

[56] References Cited

U.S. PATENT DOCUMENTS

| | | | |
|---|---|---|---|
| 3,289,112 | 11/1966 | Brown | 333/24.2 |
| 3,761,924 | 9/1973 | McGowan | 343/5 R |
| 4,005,375 | 1/1976 | Pringle et al. | 333/17 L X |
| 4,044,357 | 8/1977 | Goldie | 343/17.5 |
| 4,165,492 | 8/1979 | Motola et al. | 328/165 |
| 4,193,047 | 3/1980 | Carter et al. | 333/17 L |
| 4,283,692 | 8/1981 | Adam | 333/17 L |
| 4,488,122 | 12/1984 | Wolkstein | 333/24.1 X |

Primary Examiner—Paul Gensler
Attorney, Agent, or Firm—Donald J. Singer; William Stepanishen

[57] ABSTRACT

The signal-to-noise enhancer can be used in frequency memory loops to prevent loop capture by noise. If a frequency selective limiter is incorporated in the loop, more than one signal can be stored simultaneously because the limiter prevents the loop amplifier from saturating. At present, the limiter must be a separate device. The frequency selective signal-to-noise enhancer/limiter apparatus comprises an enhancer apparatus and a limiter apparatus on a single substrate, using a single pair of magnets to bias both units.

6 Claims, 6 Drawing Figures

FREQUENCY SELECTIVE SIGNAL-TO-NOISE ENHANCER/LIMITER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an enhancer/limiter apparatus, and in particular to a frequency selective signal-to-noise enhancer/limiter apparatus.

The signal-to-noise enhancer has the property that low-level signals are strongly attenuated while high-level signals suffer much lower attenuation. This occurs on a frequency selective basis. If the enhancer is placed in a frequency memory loop, broadband low level noise can be suppressed while strong coherent signals build up on each recirculation until some component of the loop saturates.

At present, the loop amplifier is the device which saturates first. This reduces the loop gain to unity at the stored frequency and steady state oscillation takes place. If a second strong signal is injected into the loop, it may capture the loop, but in general, the two signals cannot coexist because the saturation of the amplifier will cause the loop gain to drop below unity at one or the other of the two frequencies.

A frequency selective limiter can be inserted into the loop to prevent the loop amplifier from saturating. This allows a second signal to drive the loop gain at its frequency above unity through the action of the enhancer, and results in a sustained oscillation at its frequency, without affecting the existing signal. Thus, both or more signals can be stored simultaneously. The present signal-to-noise enhancers show a limiting effect at power levels about 25 dB above the enhancement threshold, but experiment shows the effect is too small to be effective in preventing the loop amplifier from saturating.

SUMMARY OF THE INVENTION

The present invention utilizes a single microstrip substrate on which a signal-to-noise enhancer and a power limiter apparatus share a common YIG/GGG film and a magnetic bias field. The enhancer apparatus functions in conjunction with a nichrome film which dissipates magnetostatic wave energy in the YIG film.

It is one object of the present invention, therefore, to provide an improved signal-to-noise enhancer/limiter apparatus.

It is another object of the invention to provide an improved signal-to-noise enhancer/limiter apparatus that is frequency selective.

It is yet another object of the invention to provide an improved signal-to-noise enhancer/limiter apparatus that is combined on a single microstrip substrate and share a common YIG/GGG film.

It is still another object of the invention to provide an improved signal-to-noise enhancer/limiter apparatus that utilizes a single set of biasing magnets as a bias field.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
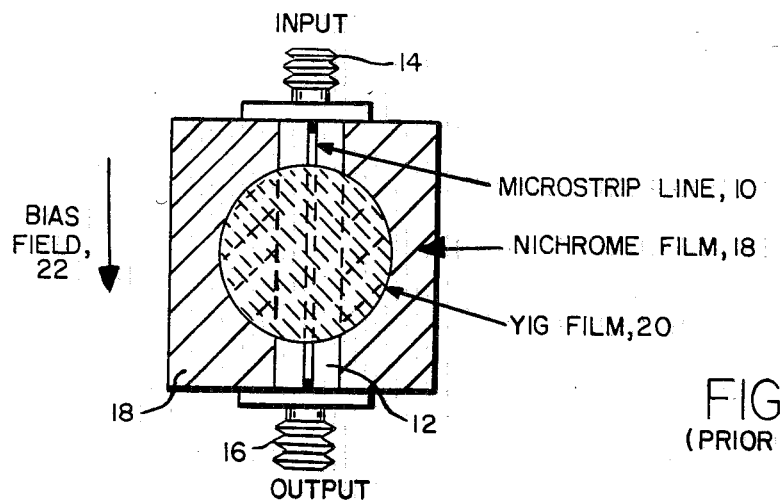
FIG. 1 schematically illustrates in plan view a signal-to-noise enhancer apparatus.

Referring now to FIG. 1, there is shown a signal-to-noise enhancer apparatus which utilizes a microstrip line 10 that is deposited upon the top surface of the substrate 12. An input connector 14 and an output connector 16 are attached to the microstrip line 10 to facilitate the application and removal of signals from the enhancer apparatus. A nichrome film 18 is deposited on the top surface of the substrate 12 and is spaced equi-distant from both sides of the microstrip line 10. The microstrip line 10 and the nichrome film 18 have substantially the same deposit thickness. A YIG film 20 is deposited as shown over the microstrip line 10 and the nichrome film 18. A magnetic bias 22 is applied to the enhancer apparatus in an orientation which is parallel to the microstrip line 10 and is directed from the input towards the output of the enhancer apparatus.

The enhancer apparatus which is shown in FIG. 1, operates in the following manner. At low signal levels, magnetostatic surface waves (MSSW) excited in the YIG film by RF current in the microstrip line carry energy away from the line. This energy is dissipated in a lossy film, typically nichrome. Above the enhancement threshold, the coupling to the magnetostatic surface waves saturates, and a larger percentage of the applied power reaches the output port, resulting in lower insertion loss.

Figure 2:
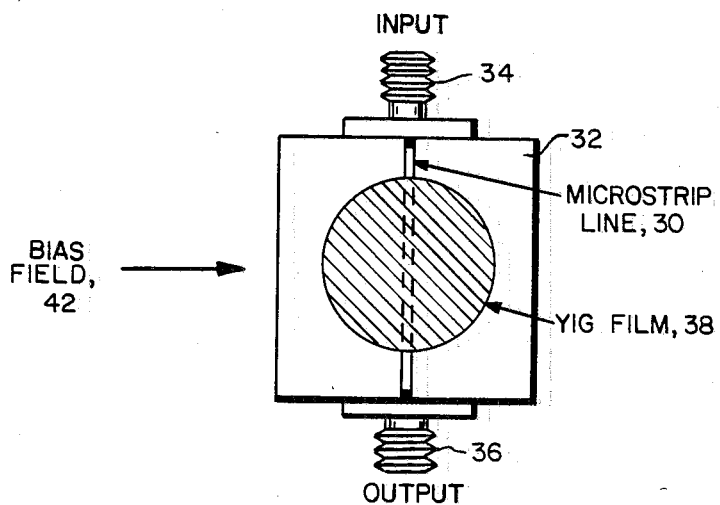
FIG. 2 schematically illustrates in plan view a YIG film limiter apparatus.
Figure 3:
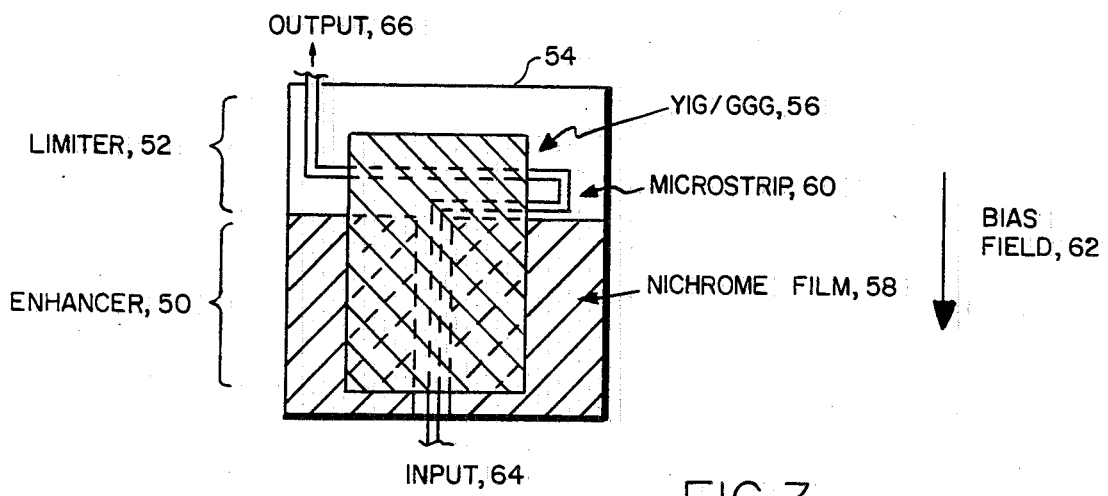
FIG. 3 schematically illustrates a combined enhancer and limiter apparatus on a common microstrip substrate according to the present invention.

Turning now to FIG. 2, there is shown a frequency selective limiter apparatus which utilizes a microstrip line 30 that is deposited upon the top surface of the substrate 32. An input connector 34 and an output connector 36 are attached to the microstrip line 30 to facilitate the application and removal of signals from the limiter apparatus. A YIG film 38 is deposited as shown over the microstrip line 30. A magnetic bias 42 is applied to the limiter apparatus in an orientation which is perpendicular to the microstrip line 30 and is directed in the plane of the YIG film 38. A frequency selective YIG limiter apparatus which is as shown in FIG. 2 operates in the following manner. At high RF signal levels, the coupling between the RF magnetic fields and the YIG becomes nonlinear, and excess power is coupled away through half-frequency spin waves. The only significant difference between FIGS. 1 and 2 is the orientation of the external DC magnetic bias field with respect to the microstrip line. It has been found that bias field levels designed to give enhancement on the 2–3 GHz band also produce limiting in the same frequency band when the bias is rotated 90°. The same transducer width and film thickness is useable in both devices as well. Thus, these two functions can be combined on a single substrate with a single YIG film, as shown in FIG. 3. Enhancement occurs in the section of microstrip which is parallel to the bias field, and limiting takes place in the section perpendicular to the line.

In FIG. 3 there is shown an enhancer apparatus 50 and a limiter apparatus 52 which are combined on a single substrate 54 and share a common YIG/GGG film 56. The nichrome film 58 which is needed only for the enhancer operation, is positioned in such a manner that the operation of the limiter apparatus 52 is not affected. The microstrip line 60 is positioned on the substrate 54 in such a manner that the orientation of the microstrip line 60 is proper and correct for the operation of both the enhancer apparatus 50 and the limiter apparatus 52. In addition, the orientation of the microstrip line 60 permits the use of a single magnetic bias field 62 which is in the plane of the microstrip line 60 and is applied in the direction shown by the arrow. The input 64 and the output 66 to the combined enhancer/limiter apparatus is as shown.

Figure 4A:
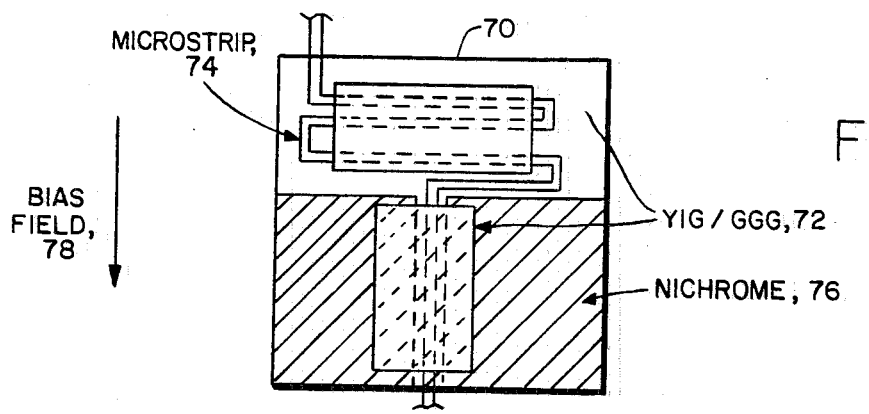
FIGS. 4A and 4B are top and side views respectively of different embodiments of frequency selective signal-to-noise enhancer/limiter apparatus; and, FIG. 5 is a graphical representation illustrating frequency limits for magnetostatic surface waves and magnetostatic volume waves in YIG film.

In FIG. 4A, there is shown a combined enhancer/limiter apparatus which is combined on a single substrate 70 but utilizing separate YIG/GG films 72. The microstrip line 74 in the limiter portion makes several parallel passes under the YIG/GGG film 72. The enhancer portion includes, as in other embodiments, the nichrome film 76 which is deposited on the substrate 70 parallel to the microstrip line 74. The YIG/GGG film 72 in the enhancer portion covers a portion of the nichrome film 76 which is on both sides of the microstrip line 74 and the microstrip line 74 in the enhancer portion of the enhancer/limiter apparatus. The bias field 78 is applied parallel to the top surface of the substrate 70 and in the direction indicated by the arrow.

Figure 4B:
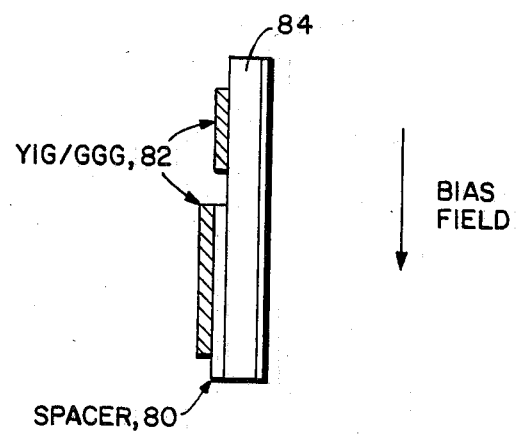

FIG. 4B shows a side view arrangement of another enhancer limiter apparatus using two separate YIG films 82. In practice, it has been found that a spacer 80 between YIG/GGG film 82 and the microstrip transducer which is on the substrate 84 improves the enhancer frequency flatness, but the limiter YIG/GGG film 82 should be in direct contact with the microstrip line. The advantage of a single integrated substrate (no interconnection problems) and a common bias field (only one pair of magnets) remain, while the performance of each section can be optimized by varying the YIG thickness, spacing, and microstrip transducer interaction length.

Figure 5:
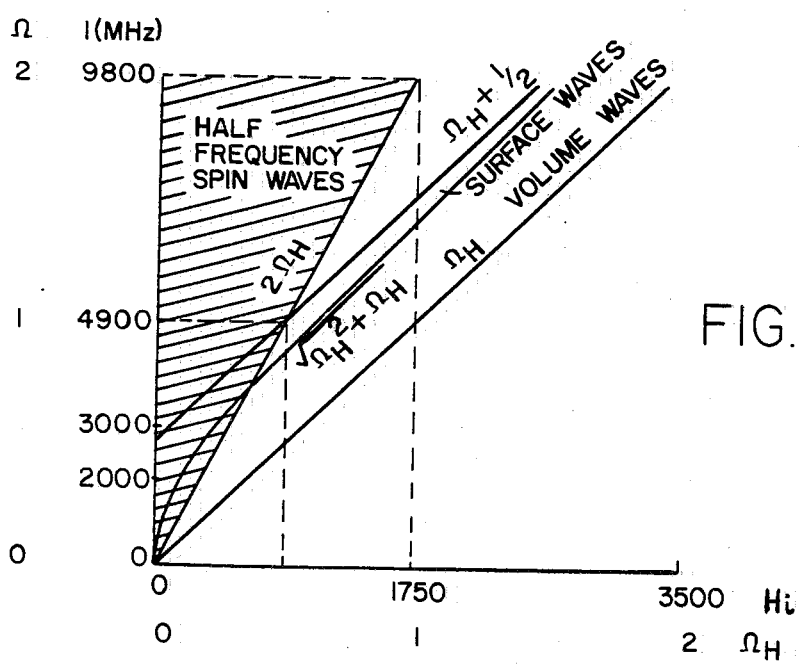

The range of operation is shown in FIG. 5 for the combined enhancer/limiter apparatus. All operation is confined to the shaded region, where half-frequency spin waves can exist. For example, at about 250 Oe, magnetostatic surface waves are excited in the enhancer section between 2 and 3 GHz. It has been shown that enhancement with a 57 μm YIG film and operation as a limiter takes place in the perpendicular bias section in the same frequency band. It has been shown that the enhancer output is compatible with the limiter input and that the calculated overall insertion loss for these devices in cascaded are in correlation. This has the desirable characteristic for a multiple frequency long term memory loop.

A signal-to-noise enhancer and power limiter can be combined on a single substrate, with a single set of biasing magnets. The characteristics of each section can be optimized separately by selecting the film thicknesses, transducer spacings and interaction lengths.

Although the invention has been described with reference to a particular embodiment, it will be understood to those skilled in the art that the invention is capable of a variety of alternative embodiments within the spirit and scope of the appended claims.

What is claimed is:

1. A frequency selective signal-to-noise enhancer/limiter apparatus comprising in combination:

a substrate with a microstrip line deposited thereon, said microstrip line having a predetermined thickness, a nichrome film deposited on said substrate on either side of and parallel to a first portion of said microstrip line, said nichrome film having a predetermined thickness, a YIG/GGG film deposited over a second portion of said microstrip line and over said first portion of said microstrip line and said nichrome film, said first portion of said microstrip line, said nichrome film and said YIG/GGG film comprising an enhancer means, said second portion of said microstrip line and said YIG/GGG film comprising a limiter means, said first portion of said microstrip line in said enhancer means being perpendicularly arranged with respect to said second portion of said microstrip line in said limiter means, and, a magnetic bias field oriented parallel to the plane of said enhancer means and said limiter means, said magnetic bias field being applied in a direction that is perpendicular to said second portion of said microstrip line in said limiter means and parallel to said first portion of said microstrip line in said enhancer means.

2. An enhancer/limiter apparatus as described in claim 1 wherein said predetermined thickness of said microstrip line and said predetermined thickness of said nichrome film are substantially equal.

3. An enhancer/limiter apparatus as described in claim 2 wherein said second portion of said microstrip line in said limiter means comprises a plurality of parallel sections of microstrip line.

4. An enhancer/limiter apparatus as described in claim 3 wherein said YIG/GGG film comprises a single YIG/GGG film.

5. An enhancer/limiter apparatus as described in claim 3 wherein said YIG/GGG film comprises a first film deposited over said substrate in the area of said enhancer means and a second film deposited over said substrate in the area of said limiter means.

6. An enhancer/limiter apparatus as described in claim 5 further including a spacer means positioned between said first film and said substrate.

* * * * *